(12) United States Patent
Werber

(10) Patent No.: US 8,466,491 B2
(45) Date of Patent: Jun. 18, 2013

(54) SEMICONDUCTOR COMPONENT WITH IMPROVED SOFTNESS

(75) Inventor: Dorothea Werber, Munich (DE)

(73) Assignee: Infineon Technologies Austria AG, Villach (AT)

(*) Notice: Subject to any disclaimer, the term of this patent is extended or adjusted under 35 U.S.C. 154(b) by 212 days.

(21) Appl. No.: 13/106,065

(22) Filed: May 12, 2011

(65) Prior Publication Data
US 2012/0286323 A1 Nov. 15, 2012

(51) Int. Cl.
*H01L 29/739* (2006.01)

(52) U.S. Cl.
USPC ........... 257/139; 257/140; 257/142; 257/368; 257/E29.197; 257/E29.202

(58) Field of Classification Search
USPC ... 257/E29.027–E29.028, E29.066–E29.067, 257/E29.194–E29.202
See application file for complete search history.

(56) References Cited

U.S. PATENT DOCUMENTS

| | | | |
|---|---|---|---|
| 7,812,427 B2 | 10/2010 | Mauder et al. | |
| 2007/0170514 A1* | 7/2007 | Mauder et al. | 257/370 |
| 2007/0272953 A1* | 11/2007 | Hirler | 257/285 |
| 2010/0078765 A1* | 4/2010 | Schulze et al. | 257/587 |
| 2011/0042715 A1* | 2/2011 | Tsukuda et al. | 257/139 |
| 2011/0186965 A1* | 8/2011 | Nemoto et al. | 257/565 |

FOREIGN PATENT DOCUMENTS

| | | |
|---|---|---|
| DE | 3631136 A1 | 3/1988 |
| DE | 102006025958 B3 | 10/2007 |

* cited by examiner

*Primary Examiner* — Mamadou Diallo
(74) *Attorney, Agent, or Firm* — Murphy, Bilak & Homiller, PLLC (57) ABSTRACT

A semiconductor component includes a semiconductor body, a first emitter region of a first conductivity type in the semiconductor body, a second emitter region of a second conductivity type arranged distant to the first emitter region in a vertical direction of the semiconductor body, a base region of one of the first and second conductivity types arranged between the first and second emitter regions and having a lower doping concentration than the first second emitter regions, a first field stop zone of the same conductivity type as the base region arranged in the base region, and a second field stop zone of the same conductivity type as the base region arranged in the base region. The second field stop zone is arranged distant to the first field stop in the vertical direction of the semiconductor, the first field stop zone is arranged between the second field stop zone and the second emitter zone, and the second field stop zone includes a plurality of field stop zone sections arranged mutually distant from each other in at least one horizontal direction of the semiconductor body.

14 Claims, 5 Drawing Sheets

SEMICONDUCTOR COMPONENT WITH IMPROVED SOFTNESS

TECHNICAL FIELD

Embodiments of the present application relate to a semiconductor component, in particular a bipolar power semiconductor component.

BACKGROUND

Bipolar power semiconductor components, like power diodes, power IGBTs (insulated gate bipolar transistors), or power thyristors, include a first emitter region of a first conductivity type, a second emitter of a second conductivity type, and a base or drift region of the first or second conductivity type arranged between the first and second emitter regions. The base region has a lower doping concentration than the first and second emitter regions. When the component is in a conducting state or on-state, charge carriers of the first conductivity type are injected into the base region from the first emitter region, and charge carriers of the second conductivity type are injected into the base region from the second emitter region. These charge carriers form a charge carrier plasma in the base region. This plasma with charge carriers of the first and second conductivity type results in a low resistance of the component in the on-state.

A diode, for example, is in the on-state when there is a voltage that causes the diode to be forward-biased, and a diode is in the off-state when the voltage causes the diode to be reverse-biased. During a transition from the forward-biased state to the reverse-biased state, which is when the diode transitions from the on-state to the off-state, these charge carriers forming the charge carrier plasma are removed from the base region. This is known as reverse recovery. During reverse recovery a reverse recovery current flows through the component caused by the removal of charge carriers from the base region. This current finally drops to zero as the charge carriers have been removed. A slope of this reverse recovery as it tends to zero defines the softness of the component. The steeper the slope, the less "soft" is the reverse recovery behaviour of the diode. A soft behaviour is desirable in that steep slopes cause voltage overshoots in parasitic inductances connected to the component and/or cause oscillations or ringing.

SUMMARY

One embodiment relates to a semiconductor component with a semiconductor body, a first emitter region of a first conductivity type in the semiconductor body, a second emitter region of a second conductivity type arranged distant to the first emitter region in a vertical direction of the semiconductor body, and a base region of the second conductivity type arranged between the first and second emitter regions and having a lower doping concentration than the first and second emitter regions. The semiconductor component further includes a first field stop zone of the second conductivity type arranged in the base region, and a second field stop zone of the second conductivity type arranged in the base region. The second field stop zone is arranged distant to the first field stop in the vertical direction of the semiconductor body, and the first field stop zone is arranged between the second field stop zone and the second emitter zone. Further, the second field stop zone includes a plurality of field stop zone sections arranged mutually distant from each other in at least one horizontal direction of the semiconductor body.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 7 that includes

DETAILED DESCRIPTION

Figure 1:
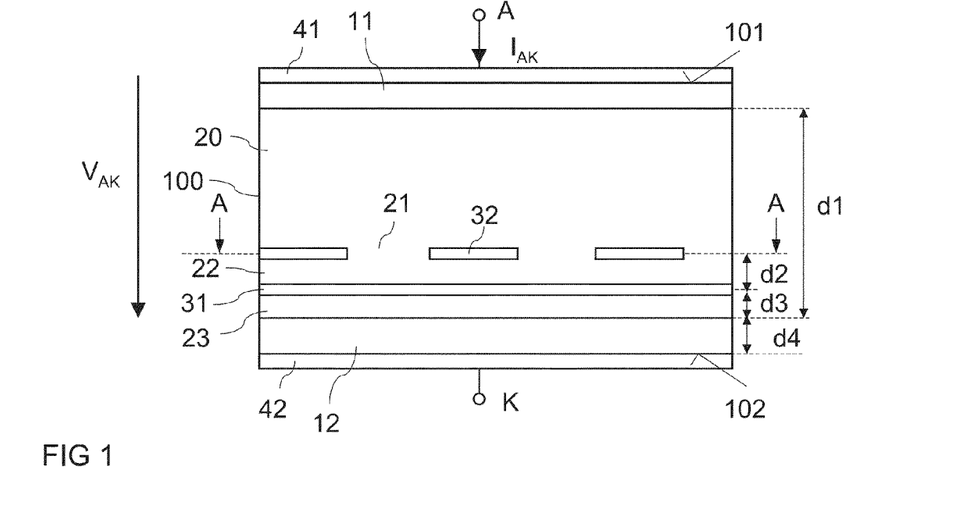
FIG. 1 illustrates a schematic cross sectional view of a semiconductor component having two field stop zones arranged in a base region.

FIG. 1 schematically illustrates a vertical cross sectional view of a semiconductor component, in particular a bipolar power semiconductor component. The semiconductor component includes a semiconductor body 100 with a first surface 101 and a second surface 102 opposite the first surface 101. The semiconductor body 100 can include a conventional semiconductor material, such as silicon (Si), etc. FIG. 1 illustrates a vertical cross section through the semiconductor body 100, which is a cross section in a vertical section plane that extends perpendicular to the first and second surfaces 101, 102.

The semiconductor component illustrated in FIG. 1 is implemented as a diode. However, this is only an example. The basic principle explained herein with reference to the diode is also applicable to other bipolar semiconductor components, such as IGBTs or thyristors, specifically GTOs (gate turn-off thyristors).

Referring to FIG. 1, the semiconductor component includes a first emitter region 11, a second emitter region 12 and a base region 20. The base region is arranged between the first emitter region 11 and the second emitter region 12 in a vertical direction v of the semiconductor body 100. The first emitter region 11 has a first conductivity type, the second emitter region 12 has a second conductivity type, and the base region 20 has one of the first and second conductivity types, but has a lower doping concentration than the first and second emitter regions 11, 12. In the embodiment illustrated in FIG. 1, the first emitter region 11 adjoins the first surface 101 of the semiconductor body 100, and the second emitter region 12 adjoins the second surface 102. A first contact electrode 41 can be arranged on the first surface 101 to electrically contact the first emitter region 11, and a second contact electrode 42 can be arranged on the second surface 102 to electrically contact the second emitter region 12. The contact electrodes 41, 42 can be implemented like conventional contact electrodes and can include a conventional contact material, such as a metal, e.g. tungsten, copper or aluminium, or a highly doped polycrystalline semiconductor material, such as polysilicon. The first contact electrode 41 forms a first terminal of the semiconductor component, and the second contact electrode 42 forms a second terminal of the diode.

For explanation purposes only it is assumed that the conductivity type of the base region 20 corresponds to the conductivity type of the second emitter region 12. Further, it is assumed that the first conductivity type of the first emitter region 11 is p-type, and that the second conductivity type of the base region 20 and the second emitter region 12 is n-type. In this case, a PN junction is formed between the first emitter region 11 and the base region 20, the first contact electrode 41 forms an anode terminal A, and the second contact electrode 42 forms a cathode terminal K of the diode. The conductivity types could be reversed and/or the conductivity type of the base region 20 may correspond to the conductivity type of the first emitter region 11 instead of the second emitter region 12.

The doping concentration of the base region 20 is, for example, in the range of between $10^{12}$ cm$^{-3}$ and $10^{15}$ cm$^{-3}$, the doping concentration of the first emitter region 11 is, for example, in the range of between $10^{17}$ cm$^{-3}$ and $10^{21}$ cm$^{-3}$. The doping concentration of the second emitter region 12 is, for example, in the range of between $10^{17}$ cm$^{-3}$ or $10^{21}$ cm$^{-3}$, or a dopant dose in the second emitter region 21 is, for example, in the range of between $10^{14}$ cm$^{-2}$ and $10^{15}$ cm$^{-2}$.

Referring to FIG. 1, the semiconductor component further includes two field stop zones, namely a first field stop zone 31, and a second field stop zone 32. The two field stop zones 31, 32 have the same conductivity type as the base region 20, which is the second conductivity type, but have a higher doping concentration than the base region 20. According to one embodiment, a (peak) doping concentration of the field stop zones 31, 32 is in the range of between $10^{15}$ cm$^{-3}$ and $10^{21}$ cm$^{-3}$.

The second field stop zone 32 includes a plurality of field stop zone sections that are arranged mutually distant from each other in at least one horizontal direction h of the semiconductor body 100, between which are arranged sections 21 of the base region 20. A section 22 of the base region 20 arranged between the first field stop zone 31 and the second field stop zone 32 is referred to as first intermediate region 22 in the following. In the embodiment illustrated in FIG. 1, the first field stop zone 31 is arranged distant to the second emitter region 12 in the vertical direction of the semiconductor body 100. A section 23 of the base region 20 arranged between the second emitter region 12 and the first field stop zone 31 is referred to as second intermediate region 23 in the following. According to another embodiment (not illustrated) the first field stop zone 31 adjoins the second emitter region 12, so that there is no second intermediate region in this embodiment.

The base region 20 has a vertical length or thickness d1. This vertical length influences the voltage blocking capability of the diode. The voltage blocking capability corresponds to the maximum reverse-biasing voltage that can be applied between the anode terminal A and the cathode terminal K without having an avalanche breakthrough setting in. A reverse-biasing voltage is a voltage that biases the PN junction in its reverse direction. In the embodiment illustrated in FIG. 1, a reverse-biasing voltage is a negative voltage $V_{AK}$ between the anode terminal A and the cathode terminal K. The vertical length d1 of the base region 20 is, therefore, dependent on a desired voltage blocking capability. As a rule of thumb: d1=$V_{BL}$·10 μm/100V, where $V_{BL}$ is the desired voltage blocking capability.

According to one embodiment, a vertical distance d2 between the first field stop zone 31 and the second field stop zone 32 is between 2 μm and 20 μm. According to a further embodiment, the vertical distance d2 between the first field stop zone 31 and the second field stop zone 32 is between 1% and 10% of the vertical length d1 of the base region 20. A vertical distance d3 between the second emitter region 12 and the first field stop zone 31 is, for example, in the range of between 5 μm and 15 μm. The overall distance d2+d3 between the second emitter 12 and the second field stop zone 32 is, for example between 10 μm and 40 μm. According to a further embodiment, a distance between the second emitter region 12 and the second field stop zone 32 is, for example, between 2% and 25%, in particular between 2% and 20%, of the vertical length d1 of the base region 20. Thus, the first and second field stop regions 31, 32 are arranged closer to the second emitter region 12 than to the first emitter region 11. The distances between the individual regions are the distances between those positions at which the individual doped regions have their highest (peak) doping concentration. In case, an individual region has a constant doping concentration, the distance from this region to other region is calculated from the middle (center) of this region.

According to one embodiment, the vertical distance d3 between the second emitter 12 and the first field stop zone 31 corresponds at least to a vertical thickness d4 of the second emitter region 12. The vertical thickness d4 of the second emitter region is, for example, in the range of between 1 μm and 10 μm.

The first and second emitter regions 11, 12 and the two field stop zones 31, 32 can be produced using conventional methods for producing emitter regions and a field stop zone of a diode. The first and second field stop zones 31, 32 may, for example, be produced by implanting dopant particles into the base region 20 via the second surface 102. A mutual distance between these two field-stop zones 31, 32 and their distance to the second surface can be adjusted by suitably selecting the implantation energy. The plurality of separate sections of the second field stop zone 32 can be obtained by using a mask (not shown) during the implantation process. The mask has openings wherein the size and the position of the individual field stop zone sections of the second field stop zone 32 are defined by the size and the position of the openings in the mask.

Figure 2:
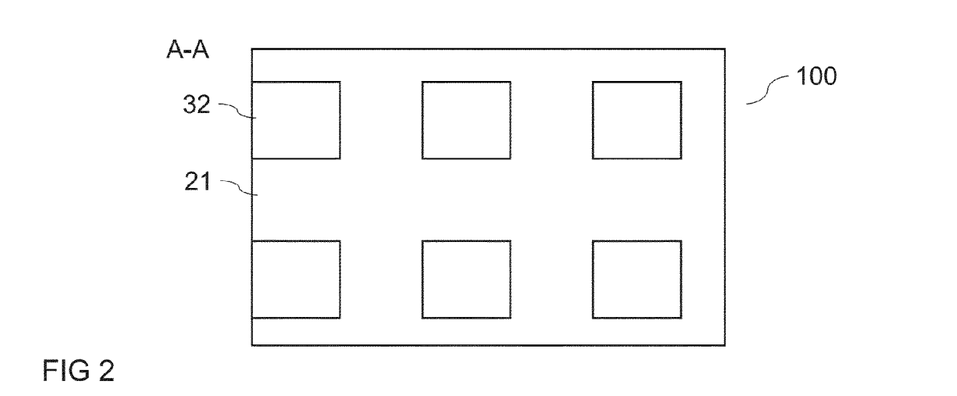
FIG. 2 illustrates a horizontal schematic cross sectional view of a second one of the field stop zones according to a first embodiment.

FIG. 2 shows a horizontal cross sectional view of the semiconductor component in a horizontal section plane A-A that goes through the second field stop zone 32. In the embodiment illustrated in FIG. 2, the individual field stop zone sections of the second field stop zone 32 have a rectangular, in particular a square, geometry. However, this is only an example. The field stop zone sections 32 could also be implemented with a geometry other than a rectangular geometry, such as an elliptical geometry, a circular geometry, or a polygonal geometry. According to a further embodiment, illustrated in FIG. 3, the field stop zone sections 32 have a stripe-shaped geometry. A minimal mutual distance between two neighboring field stop zone sections 32 is, for example, about 2 μm.

Figure 3:
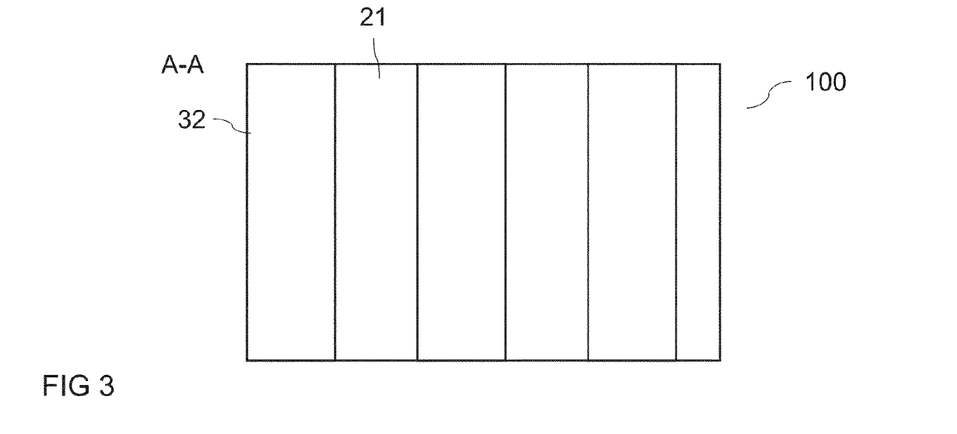
FIG. 3 illustrates a horizontal schematic cross sectional view of a second one of the field stop zones according to a second embodiment.

FIGS. 1 to 3 each only illustrate a section of the semiconductor body 100. Not shown are edge regions or edge terminations that terminate the semiconductor component in the horizontal direction of the semiconductor body 100. Conventional edge terminations can be used in connection with the semiconductor body so that no further explanation is required in this regard. The first field stop zone 31 is also arranged in the edge region. Optionally, also the second field stop zone 32 is arranged in the edge region.

Referring to FIGS. 2 and 3 each of the sections of the second field stop zone 32 has an area in the horizontal plane, where an overall area of the second field stop zone 32 is the sum of these individual section areas. Further, the sections 21 of the base region 20 laterally arranged between the field stop zone sections 32 have an overall area. A ratio r between the overall area a21 of the base region sections 21 and the overall area a32 of the field stop zone sections of the second field stop zone 32 is, for example, between a21:a32=10:1 and a21:a32=1:10, in particular between a21:a32=3:1 and a21:a32=1:3.

Figure 4:
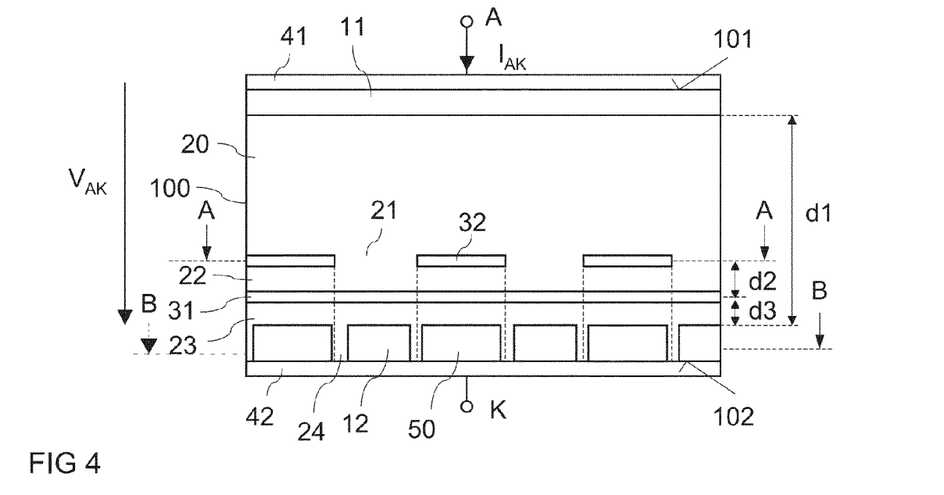
FIG. 4 illustrates a vertical schematic cross sectional view of a semiconductor component having two field stop zones arranged in a base region and having emitter short regions.

FIG. 4 shows a vertical cross sectional view of a semiconductor component according to a further embodiment. The component illustrated in FIG. 4 is a modification of the component illustrated in FIG. 1, so that everything which has been explained previously concerning doping concentrations, dopant types, distances or geometries of individual semiconductor regions, etc. of the component of FIG. 1 applies to the component of FIG. 4 accordingly. As compared with the component of FIG. 1, the component of FIG. 4 additionally includes emitter short regions 50 of the same conductivity type as the first emitter region 11 and, therefore, of a doping type that is complementary to the doping type of the base region 20. The emitter short regions 50 extend in a vertical direction from the second contact electrode 42 through the second emitter region 12. A doping concentration of the emitter short regions 50 is, for example, in the range of between $10^{17}$ cm$^{-3}$ and $10^{21}$ cm$^{-3}$. The doping concentration is in particular between $10^{18}$ cm$^{-3}$ and $10^{19}$ cm$^{-3}$. According to one embodiment (not shown) the emitter short regions 50 in the horizontal direction adjoin sections of the second emitter region 12. According to a further embodiment (illustrated in FIG. 4) sections 24 of the base region 20 are arranged in a horizontal direction between the emitter short regions 50 and the individual sections of the second emitter region 12.

Figure 5:
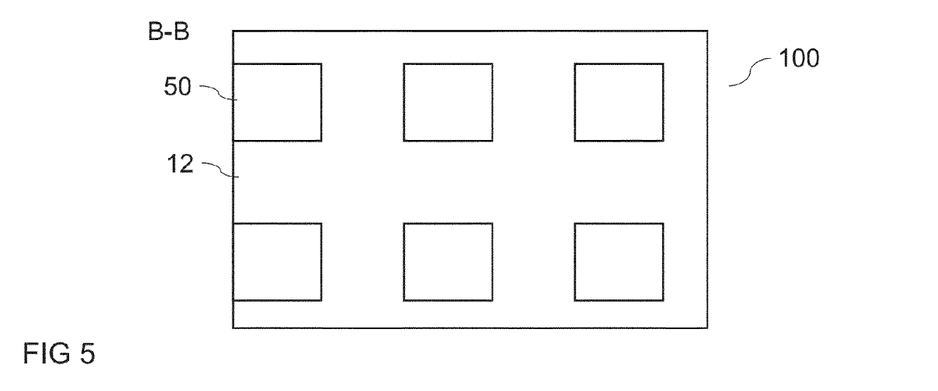
FIG. 5 illustrates a horizontal schematic cross sectional view of the emitter short regions according to a first embodiment.

FIG. 5 illustrates a horizontal cross sectional view of the component of FIG. 4 in a horizontal section plane B-B that goes through the second emitter region 12. In this embodiment, the emitter short regions 50 have a rectangular, in particular a square, geometry and are arranged mutually distant from each other in the horizontal direction. However, the emitter short regions 50 could also have a geometry other than a rectangular geometry, such as an elliptical geometry, a circular geometry or a polygonal geometry.

Figure 6:
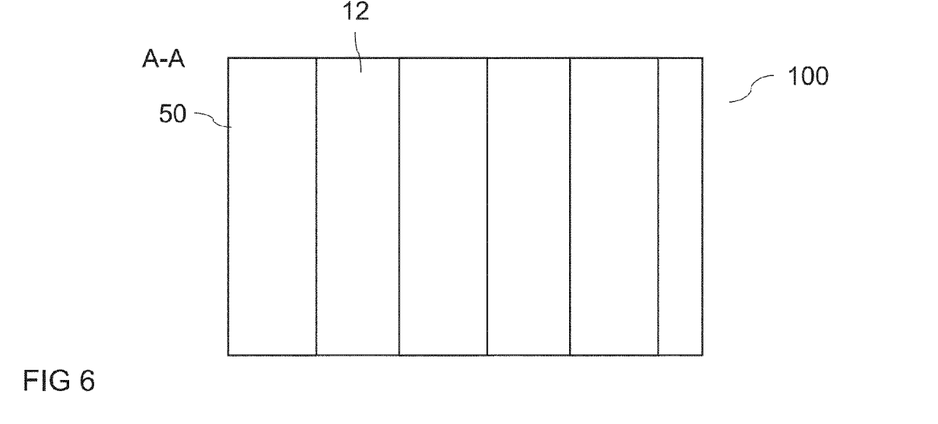
FIG. 6 illustrates a horizontal schematic cross sectional view of the emitter short regions according to a second embodiment.

According to another embodiment, illustrated in FIG. 6, the emitter short regions 50 have a stripe-shaped geometry. The geometry of the field stop zone 32 section can be independent of the geometry of the emitter short regions 50. However, the field stop zone sections of the second field stop zone 32 may at least partially overlap the emitter short regions 50. "To overlap" in this regard means that at least some of the emitter short regions 50 have a section above which at least a section of one field stop zone section 32 is arranged. In other words, a vertical projection of the field stop zone sections of the second field stop zone 32 onto the emitter short regions 50 at least partially covers the emitter short regions 50.

The operating principle of the semiconductor components of FIGS. 1 and 4 is now explained. The component is in an on-state or forward-biased state when a positive voltage ($V_{AK}$>0) is applied between the anode terminal A and the cathode terminal K. In this case, the PN junction between the first emitter region 11 and the base region 20 is forward-biased, and a current $I_{AK}$ flows between the anode terminal A and the cathode terminal K. A direction of this current $I_{AK}$ in the forward-biased state of the diode is as illustrated in FIGS. 1 and 4.

The diode is in an off-state or reverse-biased state when a negative voltage ($V_{AK}$<0) is applied between the anode terminal A and the cathode terminal K. In this case, a space charge region propagates in the base region 20 starting from the PN junction between the first emitter region 11 and the base region 20. A width of the space charge region in the vertical direction v of the semiconductor body 100 is dependent on the absolute value of the applied reverse-biasing voltage. The current $I_{AK}$ is zero, when the reverse-biasing voltage is below the voltage blocking capability of the diode.

When the diode is in the on-state, the first emitter 11 injects charge carriers of the first type into the base region 20, and the second emitter 12 injects charge carriers of the second type into the base region 20. In the example given above with regard to FIGS. 1 and 4 charge carriers of the first type are p-type charge carriers (holes) and the charge carriers of the second type are n-type charge carriers (electrons). These charge carriers form a charge carrier plasma in the base region 20 with this charge carrier plasma causing a low on-resistance of the diode. The on-resistance of the diode is the ohmic resistance between the anode terminal A and the cathode terminal K when the diode is in the on-state (forward-biased state). When the diode is switched from the on-state to the off-state, by applying a reverse-biasing voltage, the charges forming the charge carrier plasma are removed from the base region 20. This process is known as reverse recovery. During reverse recovery the current $I_{AK}$ changes its polarity, so that during reverse recovery a negative current ($I_{AK}$<0) flows. The absolute value of this negative current first increases until the absolute value reaches a maximum, before the current decreases to zero. What is, in particular, relevant is the slope the reverse recovery has as it decreases to zero. Critical are, in particular, reverse recovery scenarios in which the reverse recovery current abruptly decreases to zero. Those abrupt changes of the current may result in voltage overshoots in load inductances or parasitic inductances (not shown in FIGS. 1 and 4) connected to the diode, or may result in oscillations or ringing.

An abrupt decrease of the reverse recovery current to zero may occur when during the reverse recovery process the flow of charge carriers from the base region 20 to the first and second emitter regions 11, 12 is abruptly interrupted. Such an abrupt interruption of the charge carrier flow is prevented in the diode according to FIGS. 1 and 4. In these components, the first intermediate region 22 of the base region 20 acts as a buffer region for charge carriers, in particular for minority charge carriers. In the example given above with regard to FIGS. 1 and 4, minority charge carriers are p-type charge carriers. These minority charge carriers are "buffered" in the first intermediate region 22 until the minority charge carriers have been removed from the base region 20 between the first emitter region 11 and the second field stop zone 32. At this time, the minority charge carriers are provided from the reservoir in the first intermediate regions 22 and, therefore, prevent the minority charge carrier flow to the first emitter region 11 from being abruptly interrupted.

In the component according to FIG. 4, the emitter short regions 50 inject minority charge carriers into the base region 20 during the reverse recovery process and, thus, supply minority charge carriers to the reservoir in the first intermediate region 22. This injection of minority charge carriers during the reverse recovery process additionally helps to "soften" the reverse recovery behavior. When the injection of minority charge carriers through the emitter short regions 50 is interrupted toward the end of the reverse recovery process, there are still minority charge carriers available in the reservoir of the intermediate region 22, so that these minority charge carriers help to "soften" the reverse recovery process toward the end of the reverse recovery process, which means after the injection of minority charge carriers by the emitter short regions 50 has been stopped.

Figure 7A:
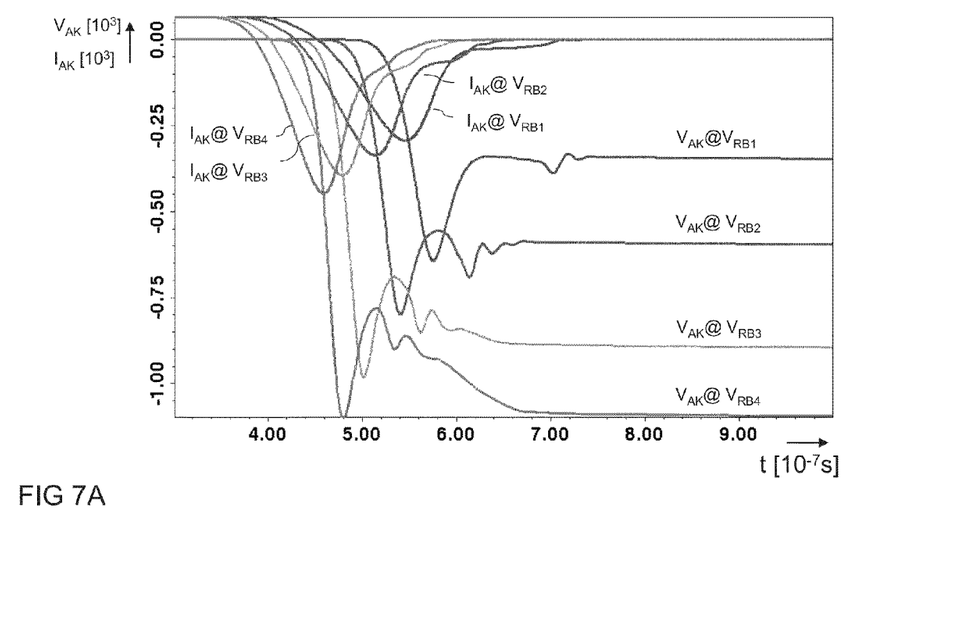
FIGS. 7A to 7C illustrates electrical characteristics of a semiconductor component according to FIG. 4.

The operating principle of the semiconductor component of FIG. 4 is now explained with reference to FIG. 7A. FIG. 7A shows timing diagrams of the voltage $V_{AK}$ between the anode and the cathode terminals A, K and of the current $I_{AK}$ during the reverse recovery process for different reverse biasing voltages. The timing diagrams of FIG. 7A were obtained for a diode with a voltage blocking capability of 1,700V, a vertical length d1 of the base region 20 of 130 μm, a dopant dose of the emitter short regions 50 of $1.24 \cdot 10^{14}$ cm$^{-2}$, a doping dose of the second emitter region 12 of $1 \cdot 10^{15}$ cm$^{-2}$, and a doping concentration of the base region 20 of $2.66 \cdot 10^{13}$ cm$^{-3}$. A forward voltage of the diode is $V_f=1.8V$.

The vertical distance d3 between the first emitter region 12 and the first field stop zone 31 of the evaluated diode is 6 μm, and a distance between the second emitter region 12 and the second field stop zone 32 is 12 μm. FIG. 7a shows the timing diagrams of the voltage $V_{AK}$ and of the current $I_{AK}$ at four different reverse-biasing voltages, namely $V_{RB1}=350V$, $V_{RB2}=600V$, $V_{RB3}=900V$, and $V_{RB4}=1200V$. These voltages are present between the anode terminal A and the cathode terminal K at the end of the reverse recovery process. It can be seen from FIG. 7A that the current $I_{AK}$ at the beginning of the reverse recovery process decreases so as to assume negative values. The absolute value of the current $I_{AK}$ first increases until a negative maximum has been reached, before the absolute value of the negative current decreases until the reverse recovery current reaches zero. Referring to FIG. 7A the peak current during the reverse recovery process, i.e. the maximum of the absolute value of the diode current $I_{AK}$, is dependent on the reverse-biasing voltage, with the magnitude of the peak current increasing with increasing reverse-biasing voltage. What is, in particular, critical during the reverse recovery process is the decrease of the reverse recovery current to zero. As can be seen from FIG. 7A, no steep current slopes of the current $I_{AK}$ occur towards the end of the reverse recovery process. This is different in semiconductor components which do not include a first and a second field stop zone.

Figure 7B:
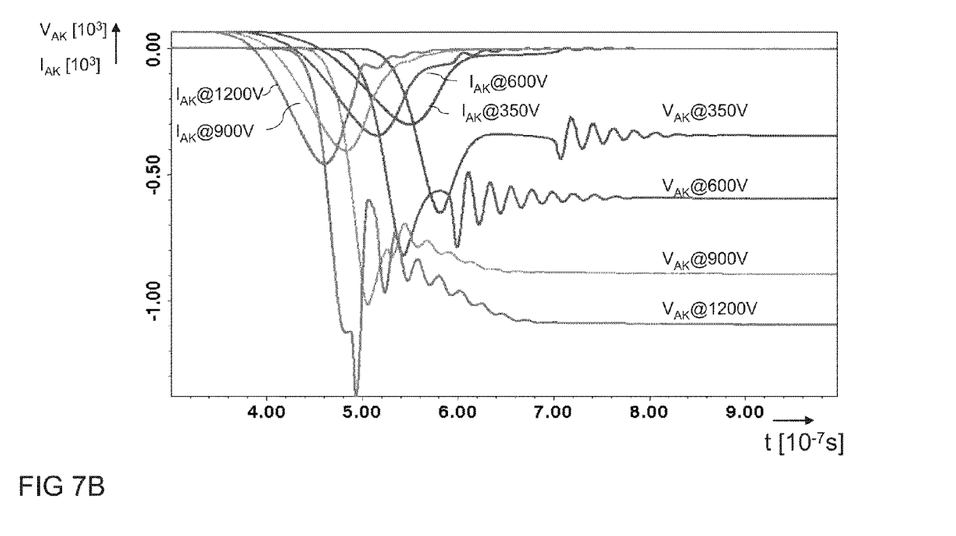
Figure 7C:
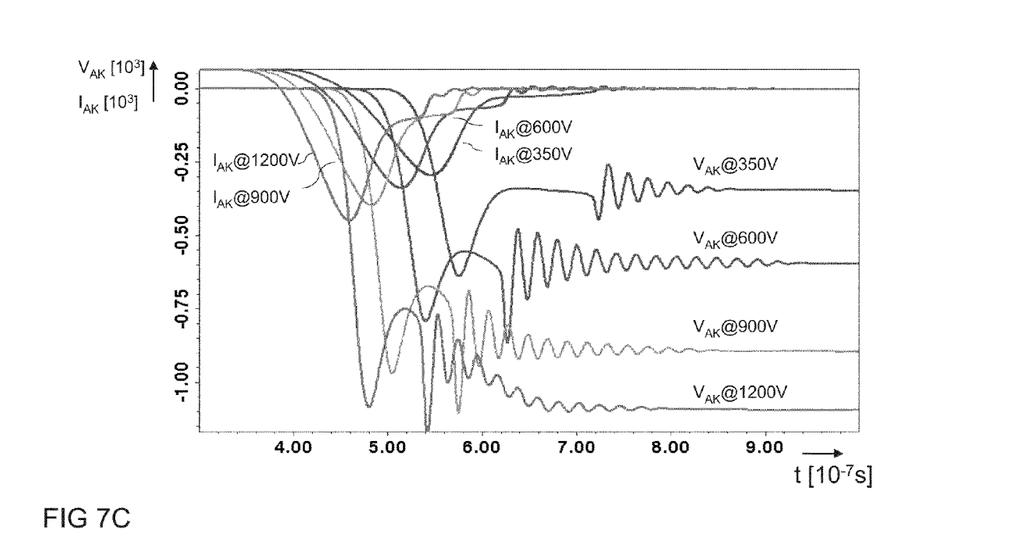

FIGS. 7B and 7C show timing diagrams of the voltage $V_{AK}$ and of the current $I_{AK}$ during the reverse recovery process for diodes that are identical to the diode for which the timing diagrams in FIG. 7A were obtained except for the fact that these diodes only have one field stop zone (which corresponds to the first field stop zone 31 in the components of FIGS. 1 and 4). In a first diode, for which the timing diagrams are illustrated in FIG. 7B, a vertical distance between the second emitter and the only one field stop zone is 12 μm, and in a second diode, for which the timing diagrams are illustrated in FIG. 7C, a vertical distance between the second emitter and the only one field stop zone is 6 μm.

It can be seen from FIGS. 7B and 7C that in these diodes, at least at some of the different reverse-biasing voltages, steep slopes or even oscillations of the current $I_{AK}$ occur towards the end of the reverse recovery process.

Figure 8:
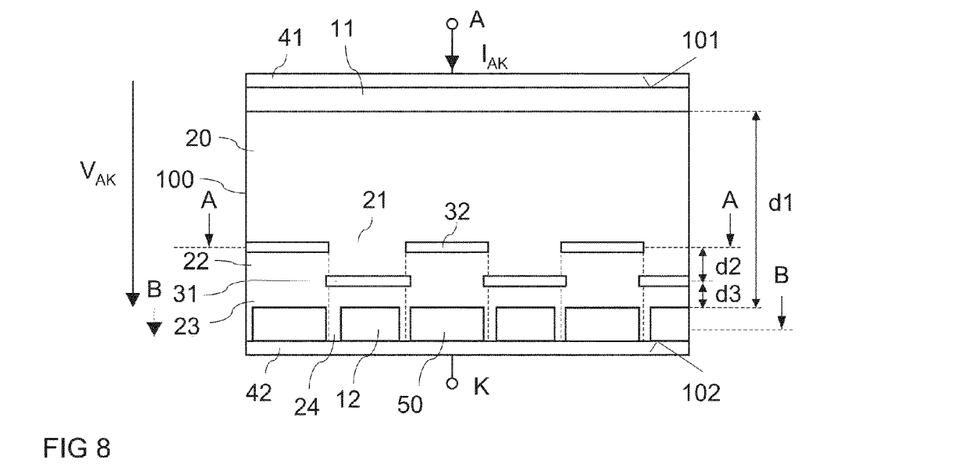
FIG. 8 illustrates a vertical schematic cross sectional view of a semiconductor component according to a third embodiment.

FIG. 8 illustrates a vertical cross section of a semiconductor component according to a further embodiment. In this component the first field stop zone 31 also includes a plurality of field stop zone sections that are mutually arranged distant to each other. The geometry of the field stop zone sections of the first field stop zone 31 may correspond to the geometry of the field stop zone sections of the second field stop zone 32. However, the forms or geometries of the field stop zone sections of the two field stop zones 31, 32 can also be different from each other. The first and second field stop zones 31, 32 overlap, which means that there is no section of the base region 31 which in the vertical direction goes through from the first emitter region 11 to the second emitter region 12 without being interrupted by at least one section of at least one of the first and second field stop zones 31, 32.

Figure 9:
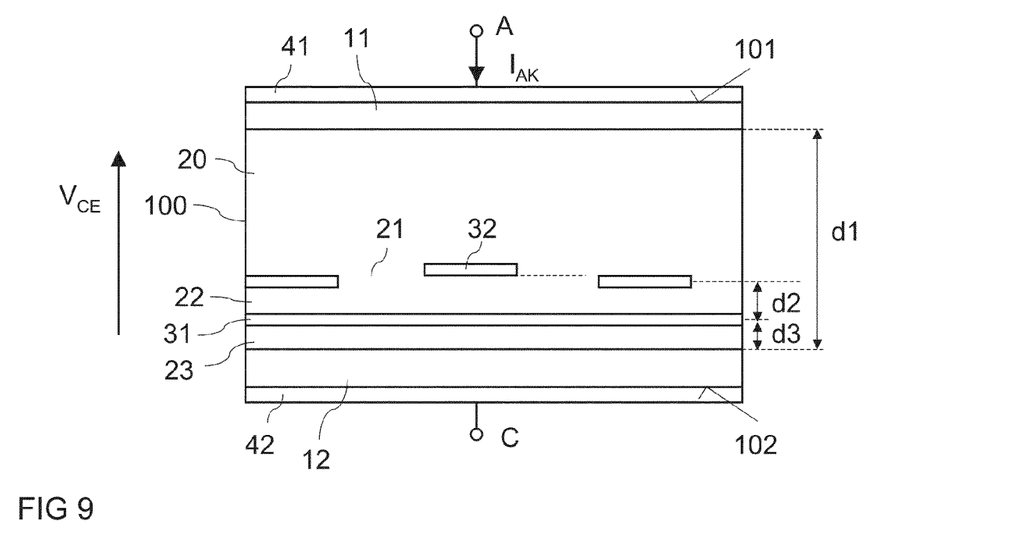
FIG. 9 illustrates a vertical schematic cross sectional view of a semiconductor component according to a fourth embodiment.

In the embodiments illustrated in FIGS. 1, 4 and 8, the field stop zone sections of one field stop zone are arranged in a common horizontal plane of the semiconductor body 100. However, this is only an example. According to a further embodiment, illustrated in FIG. 9 the individual field stop zone sections of one field stop zone, such as the second field stop zone 32 illustrated in FIG. 9, can be arranged offset to each other in the vertical direction of the semiconductor body 100. The vertical offset is, for example, in the range of several μm, such as 0.5 μm to 10 μm.

The basic concept of providing two field stop zones, such as the first and second field stop zones 31, 32 shown in FIGS. 1, 4, 8 and 9, arranged distant to each other in the vertical direction of a semiconductor body is not restricted to be used in a diode. This concept can also be used in connection with other bipolar semiconductor components, such as thyristors or IGBTs.

Figure 10:
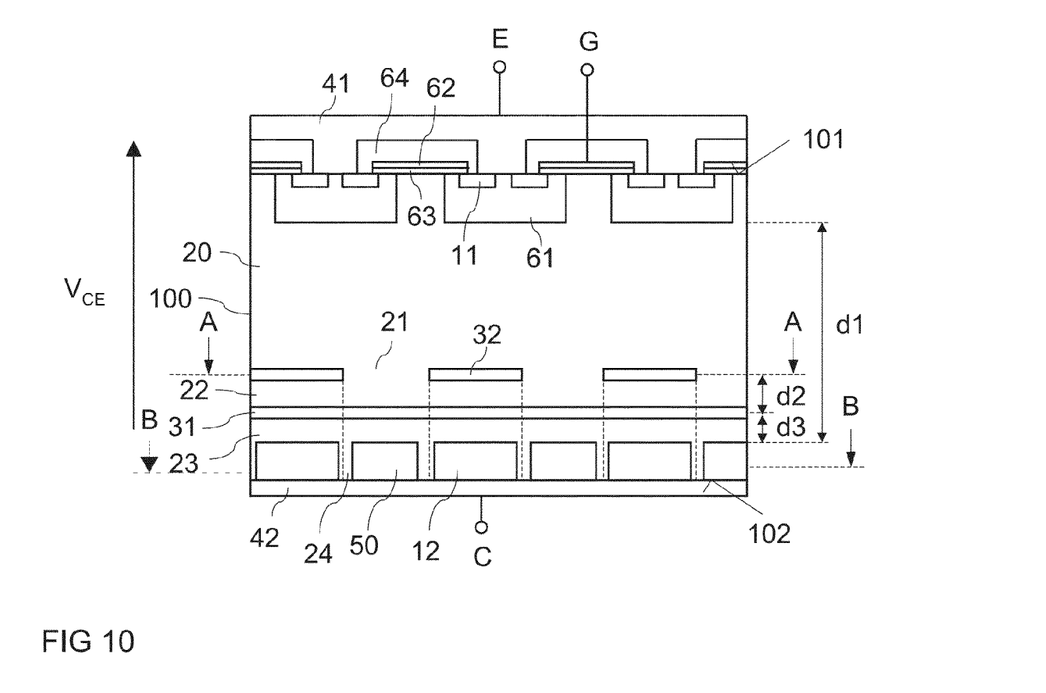
FIG. 10 illustrates a vertical schematic cross sectional view of a semiconductor component implemented as an IGBT and having first and second field stop zones arranged in a base region.

FIG. 10 illustrates a vertical cross sectional view of an IGBT. The IGBT, like the diode, includes a first emitter region 11, a second emitter region 12 and a base region 20 arranged between the first and the second emitter regions 11, 12. The first emitter region 11 can also be referred to as source regions, and the second emitter region 12 can also be referred to as a drain region. In an IGBT, the base region 20 has the same conductivity type as the first emitter region 11, which is usually an n-type. The second emitter region 12 is doped complementarily to the base region 20. The first and second emitter regions 11, 12 are arranged distant to each other in a vertical direction of the semiconductor body 100.

The first emitter region 11 is separated from the base region 20 by a body region 61 that is doped complementarily to the first emitter region 11 and the base region 20. The IGBT further includes a control structure with a gate electrode 62 that extends from the first emitter region 11 along the body region 61 to the base region 20. The gate electrode 62 is dielectrically insulated from the semiconductor body 100 by a gate dielectric 63, and is insulated from the first contact electrode 41 by an insulation layer 64.

In the embodiment illustrated in FIG. 10, the gate electrode 62 is arranged above the first surface 101 of the semiconductor body 100, and sections of the base region 20 extend to the surface 101 of the semiconductor body. This type of gate electrode shown in FIG. 10 is known as planar gate electrode. However, this is only an example. The gate electrode could also be implemented as a trench electrode that is arranged in a trench of the semiconductor body.

Referring to FIG. 10, the IGBT further includes emitter short regions 50. The emitter short regions 50 extend through the second emitter region 12 from the second contact electrode 42 to the base region 20. However, these emitter short regions 50 are optional and can be omitted. The emitter short regions 50 have the same doping type as the base region 20, but are more highly doped. In the IGBT the sections of the second emitter region 12 are at least partially overlapped by the sections of the second field stop zone 32.

In the IGBT illustrated in FIG. 10, the first field stop zone 31 is a continuous zone in the horizontal plane, and the second field stop zone 32 has a plurality of individual field stop zone sections are arranged in one horizontal plane. However, this is only an example. Any other configuration with two field stop zones that has been explained herein before, can be applied in an IGBT as well. Further, everything that has been set forth concerning doping concentrations of the individual semiconductor zone and/or their distances explained with reference to the diode herein before, applies to the IGBT accordingly, unless stated otherwise.

The IGBT is in the on-state, when a positive voltage ($V_{CE}>0$) is applied between the second contact electrode 42, which forms a collector or drain terminal, and the first contact electrode 41, which forms an emitter or source terminal, and when a suitable drive potential is applied to the gate electrode 62, so that a conducting channel (usually an inversion channel) is generated in the body region 61 between the first emitter region 11 and the base region 20.

When the IGBT is in the on-state, the first emitter region 11 injects charge carriers of the first type, namely n-type charge carriers (electrons) in the above example via the channel in the body region 61 into the base region 20, and the second emitter region 12 injects charge carriers of the second conductivity type (namely p-type charge carriers (holes) in the above example) into the base region 20.

The IGBT is in the off-state when there is a positive voltage ($V_{CE}>0$) between the collector terminal C and the emitter terminal E, and when the conducting channel in the body region 61 is interrupted. In this case a space-charge region propagates in the base region 20 starting from the pn-junction between the body region 61 and the base region 20. The body region 61 is electrically connected to the emitter electrode 41.

The behavior of the IGBT 10 when switched from the on-state to the off-state is the same as the behavior of the diode with the difference, that in the IGBT the pn-junction is formed between the body region 61 and the base region 20 and not between the first emitter region 11 and the base region 20. The mechanism of the field stop zone arrangement with the two field stop zones 31, 32 is, therefore, the same as in the diode explained herein before. Concerning the functionality of this field stop zone arrangement in the reverse recovery process of the IGBT reference is made to the description herein before.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component, comprising:
a semiconductor body;
a first emitter region of a first conductivity type in the semiconductor body;
a second emitter region of a second conductivity type arranged distant to the first emitter region in a vertical direction of the semiconductor body;
a base region of one of the first and second conductivity types arranged between the first and second emitter regions and having a lower doping concentration than the first and second emitter regions;
a first field stop zone of the same conductivity type as the base region arranged in the base region; and
a second field stop zone of the same conductivity type as the base region arranged in the base region, the second field stop zone arranged distant to the first field stop zone in the vertical direction of the semiconductor, the first field stop zone arranged between the second field stop zone and the second emitter region, and the second field stop zone including a plurality of field stop zone sections arranged mutually distant from each other in at least one horizontal direction of the semiconductor body.

2. The semiconductor component of claim 1, wherein sections of the base region are arranged between neighbouring field stop zone sections of the second field stop zone and wherein a ratio between an overall area of the field stop zone sections and the overall area of the base region sections is between 10:1 and 1:10.

3. The semiconductor component of claim 1, wherein the first field stop zone includes a plurality of field stop zone sections arranged mutually distant from each other in at least one horizontal direction of the semiconductor body.

4. The semiconductor component of claim 3, wherein the field stop zone sections of the second field stop zone at least partially overlap the field stop zone sections of the first field stop zone such that each section of the base region that extends in a vertical direction from the first emitter region to the second is interrupted by at least one of a field stop zone section of the first field stop zone and a field stop zone section of the second field stop zone.

5. The semiconductor component of claim 1, wherein the field stop zone sections of the second field stop zone are arranged in a single horizontal plane.

6. The semiconductor component of claim 1, wherein the field stop zone sections of the second field stop zone are arranged in at least two different horizontal planes, so that there is a vertical offset between at least some of the field stop zone sections.

7. The semiconductor component of claim 1, wherein the base region has a vertical length, and wherein a distance between the second emitter region and the second field stop zone is between 2% and 20% of the vertical length of the base region.

8. The semiconductor component of claim 1, wherein the base region has a vertical length, and wherein a distance between the first field stop zone and the second field stop zone is between 1% and 15% of the vertical length of the base region.

9. The semiconductor component of claim 1, wherein the semiconductor component is a diode, the base region is of the second conductivity type, and a pn-junction is formed between the first emitter region and the base region.

10. The semiconductor component of claim 9, further comprising:
    an electrode contacting the second emitter region; and
    a plurality of emitter short regions of the first conductivity type extending in the vertical direction from the electrode through the second emitter region.

11. The semiconductor component of claim 10, wherein the field stop zone sections of the second field stop zone at least partially overlap the emitter short regions.

12. The semiconductor component of claim 1, wherein the semiconductor component is an IGBT, the base region is of the first conductivity type, and the IGBT further comprises:
    a body region of the second conductivity type arranged between the first emitter region and the base region; and
    a control structure with a gate electrode.

13. The semiconductor component of claim 12, further comprising:
    an electrode contacting the second emitter region; and
    a plurality of emitter short regions of the first conductivity type extending in the vertical direction from the electrode through the second emitter region.

14. The semiconductor component of claim 13, wherein the field stop zone sections of the second field stop zone at least partially overlap regions of the second emitter region.

* * * * *